United States Patent
Shen et al.

(10) Patent No.: US 11,437,568 B2
(45) Date of Patent: Sep. 6, 2022

(54) MEMORY DEVICE AND METHODS OF MAKING SUCH A MEMORY DEVICE

(71) Applicant: GLOBALFOUNDRIES U.S. Inc., Santa Clara, CA (US)

(72) Inventors: Yanping Shen, Saratoga Springs, NY (US); Haiting Wang, Clifton Park, NY (US); Sipeng Gu, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 32 days.

(21) Appl. No.: 16/836,434

(22) Filed: Mar. 31, 2020

(65) Prior Publication Data

US 2021/0305495 A1    Sep. 30, 2021

(51) Int. Cl.
| | | |
|---|---|---|
| *H01L 43/02* | (2006.01) | |
| *H01L 27/22* | (2006.01) | |
| *G11C 11/16* | (2006.01) | |
| *H01L 43/12* | (2006.01) | |

(52) U.S. Cl.
CPC ............ *H01L 43/02* (2013.01); *G11C 11/161* (2013.01); *H01L 27/222* (2013.01); *H01L 43/12* (2013.01)

(58) Field of Classification Search
CPC ...... G11C 11/161; H01L 43/02; H01L 27/222
See application file for complete search history.

(56) References Cited

U.S. PATENT DOCUMENTS

| | | | |
|---|---|---|---|
| 10,439,134 B2 | 10/2019 | Majhi et al. | |
| 2006/0284237 A1* | 12/2006 | Park | H01L 27/2463 |
| | | | 257/314 |
| 2007/0172964 A1 | 7/2007 | Yen et al. | |
| 2008/0230373 A1* | 9/2008 | Kim | H01L 45/144 |
| | | | 204/192.15 |
| 2009/0091038 A1 | 4/2009 | Chen et al. | |
| 2009/0098703 A1* | 4/2009 | Ha | H01L 27/2409 |
| | | | 438/383 |
| 2009/0261433 A1* | 10/2009 | Kang | H01L 43/02 |
| | | | 257/421 |
| 2012/0032287 A1 | 2/2012 | Li et al. | |
| 2014/0131651 A1 | 5/2014 | Tu et al. | |
| 2015/0171314 A1 | 6/2015 | Li et al. | |
| 2016/0093668 A1 | 3/2016 | Lu et al. | |
| 2016/0133828 A1 | 5/2016 | Lu et al. | |

(Continued)

OTHER PUBLICATIONS

Kozicki and Barnaby, "Conductive bridging random access memory—materials, devices and applications," Semicond. Sci. Technol., 31:113001, 2016.

(Continued)

*Primary Examiner* — Shih Tsun A Chou
(74) *Attorney, Agent, or Firm* — Anthony Canale; Hoffman Warnick LLC

(57) ABSTRACT

One illustrative memory cell disclosed herein includes at least one layer of insulating material having a first opening and an internal sidewall spacer positioned within the first opening, wherein the internal sidewall spacer includes a spacer opening. The memory cell also includes a bottom electrode positioned within the spacer opening, a memory state material positioned above an upper surface of the bottom electrode and above an upper surface of the internal sidewall spacer, and a top electrode positioned above the memory state material.

13 Claims, 10 Drawing Sheets

(56) References Cited

U.S. PATENT DOCUMENTS

2019/0165258 A1* 5/2019 Peng ................... G11C 11/161
2020/0279998 A1* 9/2020 Lin ....................... H01L 45/06
2021/0043827 A1* 2/2021 Hashemi ............... H01L 43/08

OTHER PUBLICATIONS

Li et al., "An overview of resistive random access memory devices," Chinese Science Bulletin, 56:3072-78, Oct. 2011.

* cited by examiner

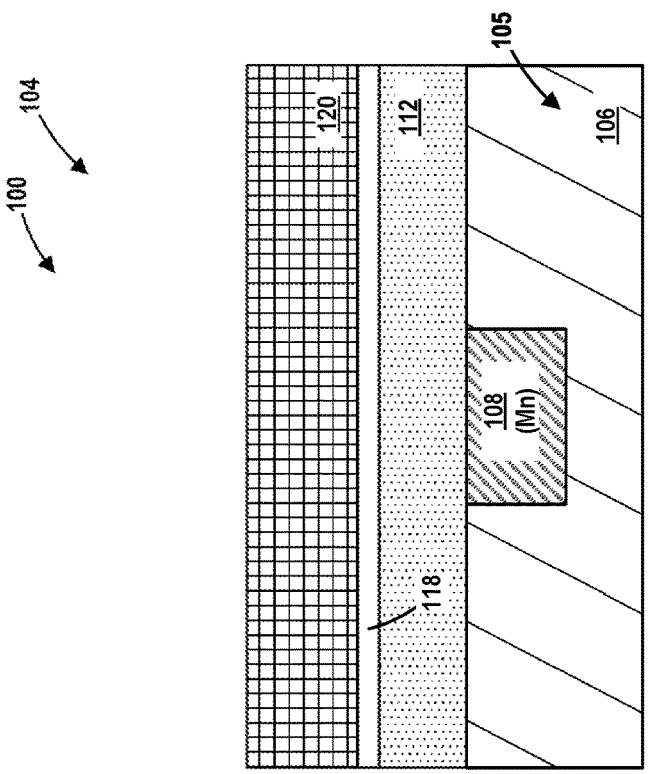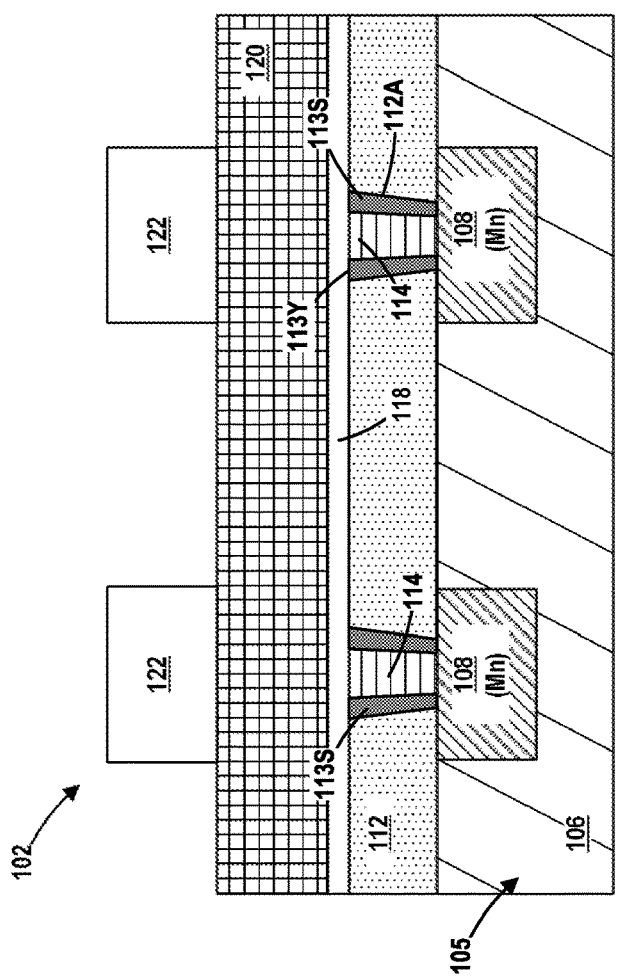
Fig. 5

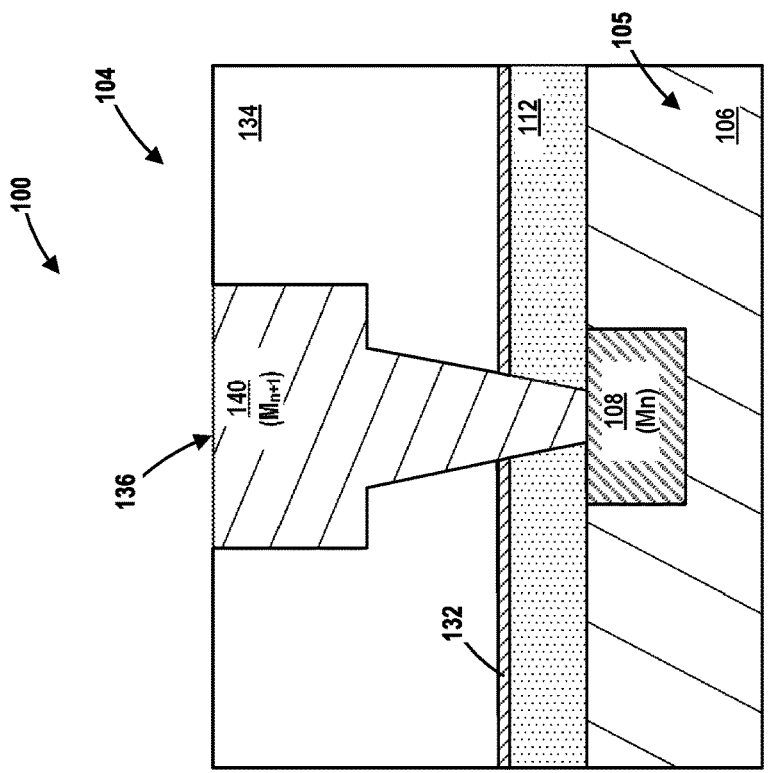
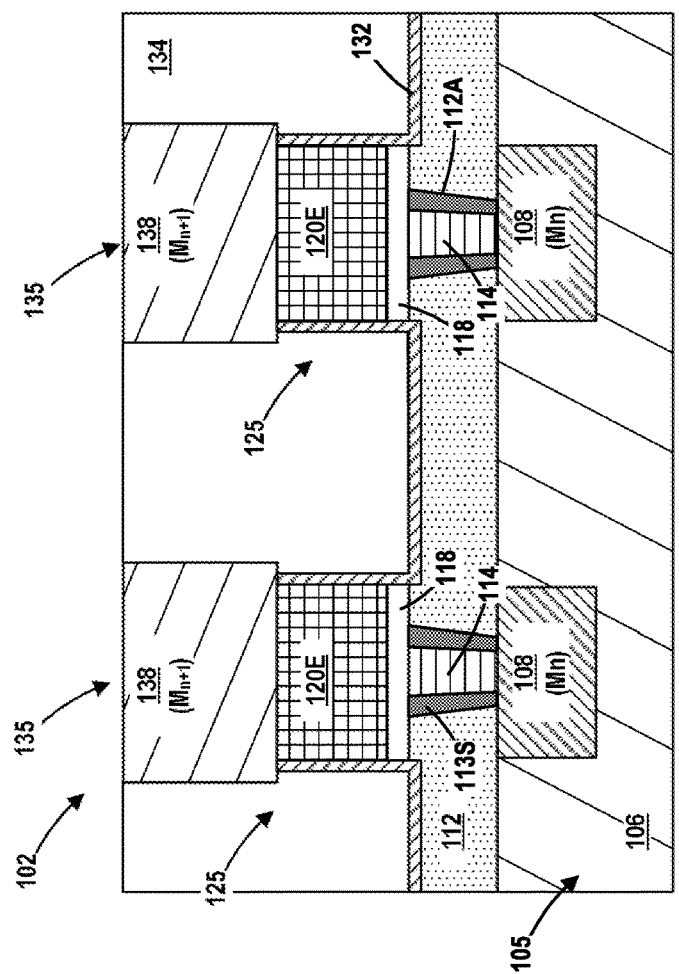
Fig. 10

MEMORY DEVICE AND METHODS OF MAKING SUCH A MEMORY DEVICE

BACKGROUND OF THE INVENTION

Field of the Invention

The present disclosure generally relates to the fabrication of integrated circuits, and, more particularly, to various novel embodiments of a memory device and various novel methods of making such a memory device on an integrated circuit (IC) product.

Description of the Related Art

In many modern integrated circuit products, embedded memory devices and logic circuits (e.g., microprocessors) are formed on the same substrate or chip. Such embedded memory devices may come in a variety of forms, e.g., an MTJ (magnetic tunnel junction) memory device, an RRAM (resistive random access memory) device, a PRAM (phase-change random access memory) device, an MRAM (magnetic random access memory) device, a FRAM (ferroelectric random access memory) device, etc. Typically, all of the embedded memory devices have a top electrode to which a conductive contact structure must be formed for the device to be operational.

Such memory devices typically include some form of a memory state material that is typically positioned between a bottom electrode and a top electrode, e.g., the switching layer in an RRAM device. In some applications, some characteristic of the memory state material, e.g., resistivity, may be altered by the application of an electrical charge to the memory device, and these altered states may be representative of a logical "1" or a logical "0" in a digital circuit. In some situations, one or more conductive filaments is formed in the memory state material when electrical charge is applied to the memory device. However, in some cases, these conductive filaments may be weak and/or non-uniform, thereby reducing one or more operational performance characteristics of the memory device.

Accordingly, improvements in memory devices and methods of making such memory devices are desired within the industry.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel embodiments of a memory device and various novel methods of making such a memory device on an IC product. One illustrative memory cell disclosed herein includes at least one layer of insulating material having a first opening and an internal sidewall spacer positioned within the first opening, wherein the internal sidewall spacer includes a spacer opening. The memory cell also includes a bottom electrode positioned within the spacer opening, a memory state material positioned above an upper surface of the bottom electrode and above an upper surface of the internal sidewall spacer, and a top electrode positioned above the memory state material.

One illustrative method disclosed herein for forming a memory cell includes forming an opening in at least one layer of insulating material and forming an internal sidewall spacer within the opening, wherein the internal sidewall spacer includes a spacer opening. In this example, the method also includes forming a bottom electrode within the spacer opening, forming a memory state material above an upper surface of the bottom electrode and above an upper surface of the internal sidewall spacer, and forming a top electrode above the memory state material.

BRIEF DESCRIPTION OF THE DRAWINGS

The disclosure may be understood by reference to the following description taken in conjunction with the accompanying drawings, in which like reference numerals identify like elements, and in which:

FIGS. 1-10 depict various novel embodiments of a memory device and various novel methods of making such a memory device on an IC product. The drawings are not to scale.

Figure 1:
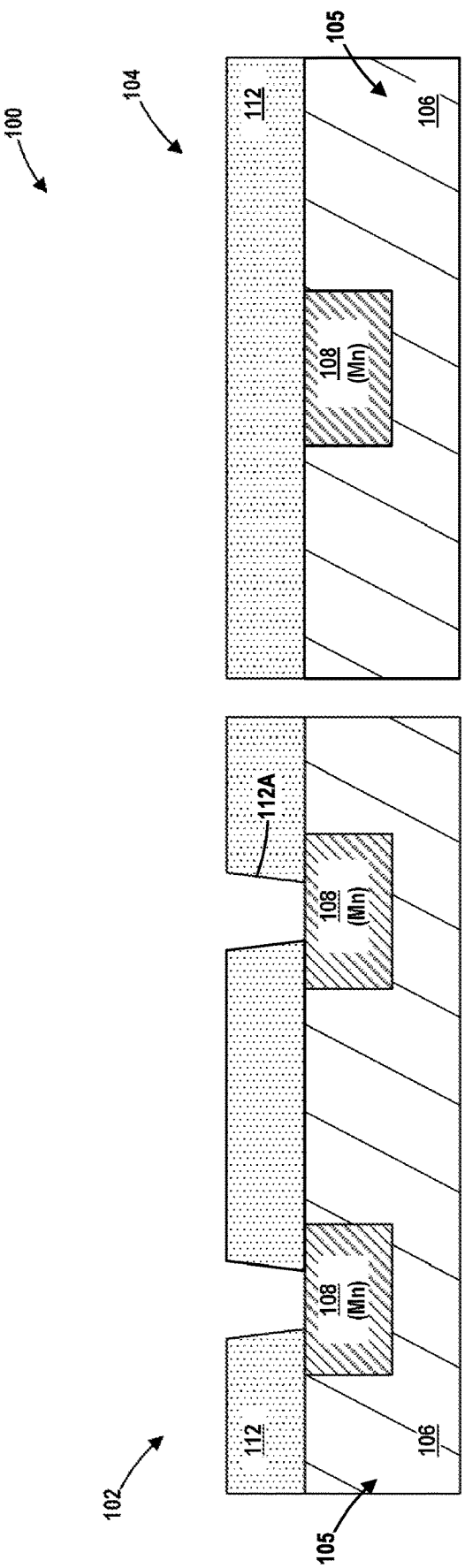

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed structures and method may be applicable to a variety of products, stand-alone memory products, embedded memory products, etc. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 1-10 depict various novel embodiments of a memory device and various novel methods of making such a memory device on an IC product. The IC product 100 will be formed on and above a semiconductor substrate (not shown). The semiconductor substrate may have a variety of configurations, such as a bulk silicon configuration. The substrate may also have a semiconductor-on-insulator (SOI) configuration that includes a base semiconductor layer, a buried insulation layer and an active semiconductor layer positioned above the buried insulation layer, wherein transistor devices (not shown) that are formed on the substrate are formed in and above the active semiconductor layer. The substrate may be made of silicon or it may be made of materials other than silicon. Thus, the terms "substrate" or "semiconductor substrate" should be understood to cover all semiconducting materials and all forms of such materials.

In general, and with reference to FIG. 1, the IC product 100 comprises a memory region 102 where one or more memory devices will be formed and a logic region 104 where one or more logic circuits (e.g., microprocessor circuits) will be formed in and above a semiconductor substrate (not shown in the attached figures). As is typical, the IC product 100 includes a plurality of metallization layers that constitute the overall wiring pattern for the IC product 100. These metallization layers may be formed on the IC product 100 by performing traditional manufacturing processes. These metallization layers are typically comprised of layers of insulating material (e.g., silicon dioxide) with a plurality of conductive metal lines and/or conductive vias formed in the layers of material. The conductive metal lines are routed across the substrate in various patterns and arrangements and provide the means for intra-layer electrical communication between the devices and structures formed on or above the substrate. The conductive vias provide the means for allowing electrical communication between the conductive metal lines in adjacent metallization layers. The first metallization layer of an IC product is typically referred to as the "M1" layer (or in some cases the "M0" layer), while the conductive vias that are used to establish electrical connection between the M1 layer and the conductive lines in the immediately adjacent upper metallization layer (the "M2 layer) are typically referred to as "V1" vias. So-called device level contacts (not shown) are formed above the substrate so as to provide electrical communication between the various devices, e.g., transistors, resistors, etc., that are formed on or immediately adjacent the semiconductor substrate.

FIG. 1 depicts the IC product 100 after several process operations were formed. More specifically, FIG. 1 depicts the product 100 at a point in time wherein an illustrative (and representative) metallization layer 105 has been formed above the semiconductor substrate (not shown). As will be appreciated by those skilled in the art after a complete reading of the present application, the metallization layer 105 is intended to be representative of any metallization layer that may be formed on the IC product 100 irrespective of its location relative to an upper surface of the semiconductor substrate or any of the other metallization layers formed on the IC product 100.

With continued reference to FIG. 1, the product 100 is depicted at a point in time where a layer of insulating material 106, e.g., silicon dioxide or a low-k material, for a representative metallization layer—$M_n$—of the IC product 100 has been formed above the semiconductor substrate. As noted above the $M_n$ metallization layer is intended to be representative of any metallization layer formed at any level on the IC product 100. In the example shown in FIG. 1, various illustrative conductive metal lines 108 have been formed in the layer of insulating material 106 in both the memory region 102 and the logic region 104. The number, size, shape, configuration and overall routing of the metal lines 108 may vary depending upon the particular application. In one example, the conductive metal lines 108 are elongated features that extend across the product 100 in a direction that is transverse to the plane of the drawing in FIG. 1. The metal lines 108 may be comprised of any of a variety of different conductive materials, e.g., copper, aluminum, tungsten, etc., and they may be formed by traditional manufacturing techniques, e.g., by performing a damascene process for cases where the conductive lines 108 are made of copper and perhaps by performing traditional deposition and etching processes when the conductive lines 108 are made of a conductive material that may readily be patterned using traditional masking and patterning (e.g., etching) techniques.

Also depicted in FIG. 1 is a layer of insulating material 112 that was blanket deposited on the IC product 100. If desired, a planarization process may be performed on the layer of insulating material 112 to substantially planarize its upper surface. The layer of insulating material 112 is representative in nature is that it may represent a single layer of material or multiple layers of material. The single or multiple layers of insulating material 112 may be comprised of a variety of different insulating materials, e.g., silicon carbon nitride (SiCN), SiN, $Al_2O_3$, $HfO_x$, $SiO_2$, SiON, SiOCN, etc., and its vertical thickness may vary depending upon the particular application.

Figure 2:
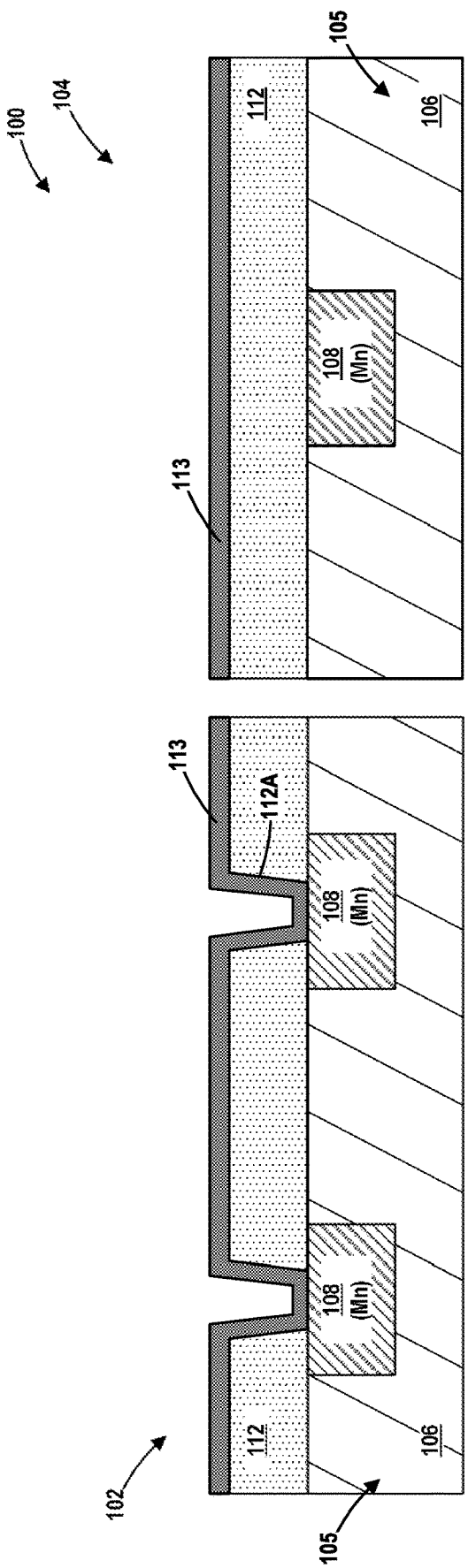

Next, a patterned etch mask (not shown) was formed on the IC product 100. This particular patterned etch mask covers the logic region 104 but exposes portions of the layer of insulating material 112 at locations in the memory region 102 where it is desired to establish electrical contact with the conductive lines 108 formed in the layer of insulating material 106 within the memory region 102. At that point, an etching process was performed through the patterned etch mask (not shown) so as to remove exposed portions of the layer of insulating material 112 in the memory region 102. This etching process operation results in the formation of overall contact openings 112A that extend through the layer of insulating material 112 and thereby expose at least a portion of the upper surface of the conductive lines 108 in the memory region 102. At that point, the patterned etch mask may be removed FIG. 2 depicts the IC product 100 after a conformal deposition process was performed to form a conformal layer of spacer material 113 across the product 100 and in the contact openings 112A. The layer of spacer material 113 may be of any desired thickness, e.g., 5-20 nm, and it may be comprised of any of a variety of different materials, e.g., SiN, SiCN, SiOCN, SiC, SiOC, $Al_2O_3$, amorphous silicon, etc.

Figure 3:
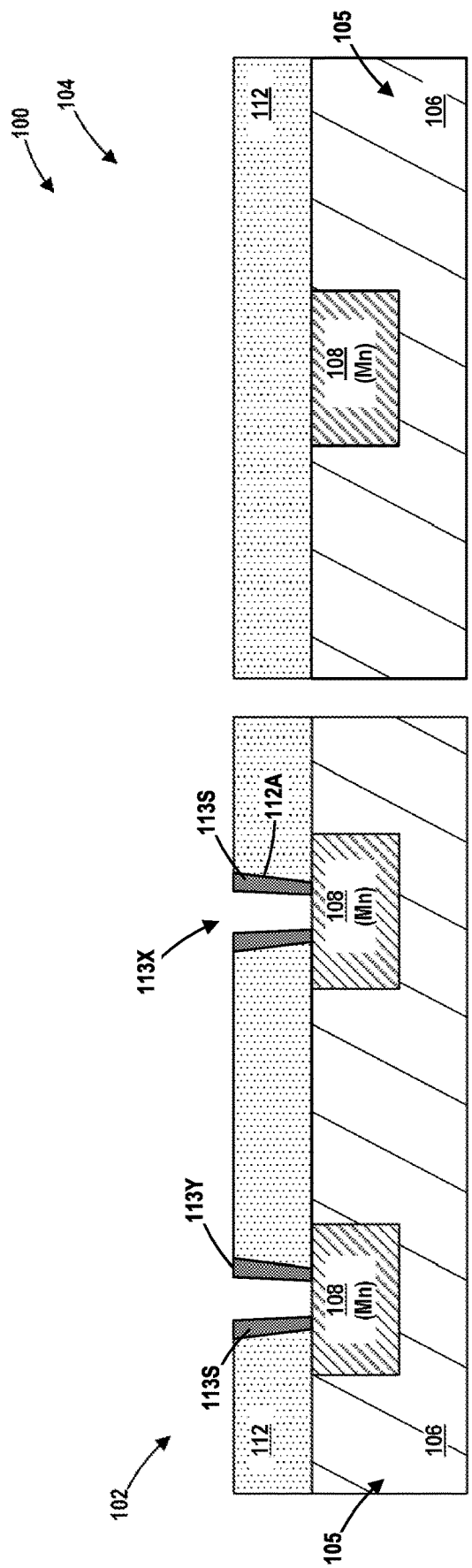

FIG. 3 depicts the product 100 after an anisotropic etching process was performed to remove horizontally positioned portions of the layer of spacer material 113. This etching process results in the formation of the above-mentioned internal sidewall spacer 113S in each of the contact openings 112A. The internal sidewall spacer 113S has a spacer opening 113X. The internal sidewall spacers 113S may be of any desired thickness (as measured at its base), e.g., 5-20 nm.

Figure 4:
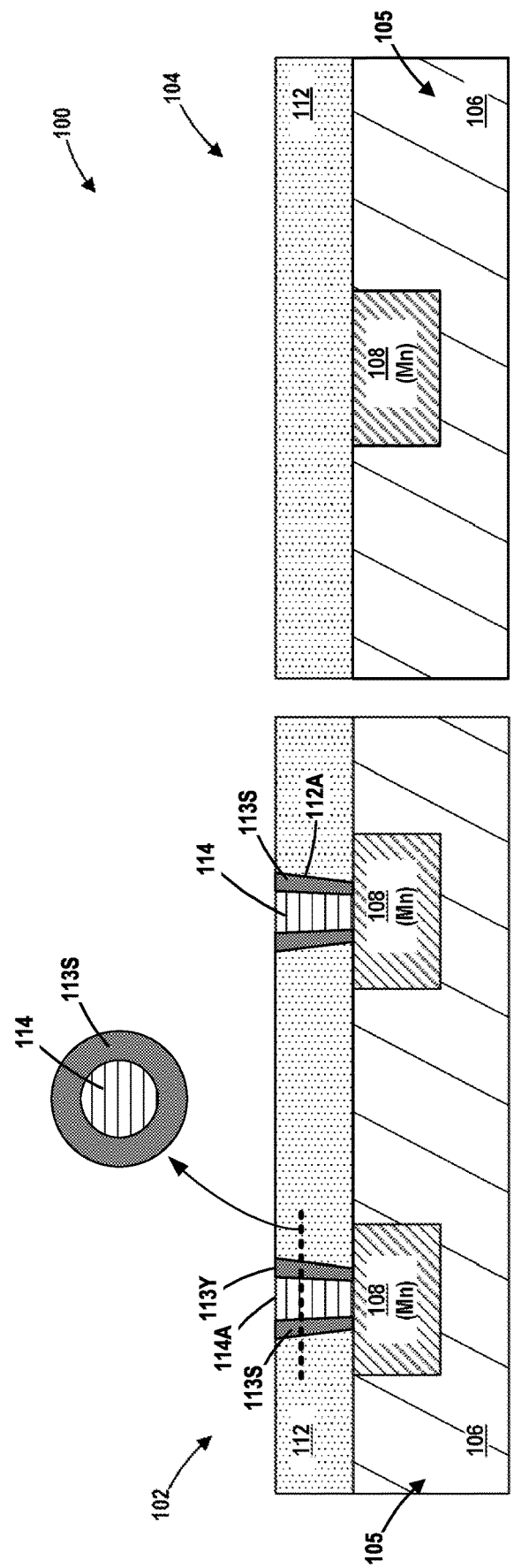

FIG. 4 depicts the product 100 after a self-aligned bottom electrode 114 for the memory cells 125 was formed in each of the spacer openings 113X. The bottom electrodes 114 have an upper surface area 114A. The bottom electrodes 114 may be formed by performing traditional manufacturing techniques. For example, one or more conductive material(s) may be deposited so as to overfill the spacer openings 113X, followed by performing a chemical mechanical planarization (CMP) process operation and/or a dry etch-back process to remove the excess amounts of the conductive material for the bottom electrodes 114 that are positioned on or above the upper surface of the layer of insulating material 112. In one illustrative embodiment, when viewed from above, the bottom electrodes 114 may have a substantially circular configuration. In other situations, the bottom electrodes 114 may have a substantially oval configuration. In one illustrative embodiment, the bottom electrode 114 is formed entirely within the spacer opening 113X such that the upper surface of the bottom electrode 114 is substantially coplanar with the upper surface 113Y of the internal sidewall spacer 113S, as shown in FIG. 4.

The vertical thickness of the illustrative vias 114 may vary depending upon the particular application, and they may be comprised of a variety of conductive materials, e.g., copper, tungsten, aluminum, TiN, TaN, etc. The bottom electrodes 114 may be comprised of the same material of construction as that of the conductive metal line 108 to which it is conductively coupled, but that may not be the case in all applications. Of course, as will be appreciated by those skilled in the art after a complete reading of the present application, various barrier layers or liner layers (neither of which is shown) may be formed as part of the process of forming the illustrative conductive lines 108 and the bottom electrodes 114. Moreover, various additional conductive structures that will be formed on the IC product 100, as discussed more fully below, may or may not include such illustrative barrier layers and/or liner layers, which are not depicted so as to not overly complicate the attached drawings.

As will be appreciated by those skilled in the art after a complete reading of the present application, the memory cells 125 depicted herein are intended to be generic and representative in nature. By way of example only, and not by way of limitation, the generic memory cells 125 depicted herein may take a variety of forms, have a variety of different configurations and may comprise different materials. For example, the memory cells 125 depicted herein may be an RRAM (resistive random access memory) device, an MTJ (magnetic tunnel junction) memory device, a PRAM (phase-change random access memory) device, an MRAM (magnetic random access memory) device, a FRAM (ferroelectric random access memory) device, etc. Such a memory cell 125 includes some form of a memory state material 118 that is typically positioned between a bottom electrode and a top electrode, e.g., the switching layer in an RRAM device. In some applications, some characteristic of the memory state material 118, e.g., resistivity, may be altered by the application of an electrical charge to the memory cell 125, and these altered states may be representative of a logical "1" or a logical "0" in a digital circuit. In some situations, the memory state material 118 may actually store an electrical charge. In any event, sensing circuitry on the IC product 100 may be used to sense the state of the memory state material 118, to determine whether or not a particular memory cell 125 represents a logical "1" or a logical "0" and use that information within the various circuits on the IC product 100. The particular materials used for the memory state material 118 may vary depending upon the particular type of memory device that is fabricated. Moreover, the single layer of memory state material 118 depicted in the drawings is intended to be representative in that, in a real-world device, the memory state material 118 may comprise a plurality of layers of material. Thus, the reference to any "memory state material" in the specification and in the attached claims should be understood to cover any form of any material(s) that may be employed on any form of a memory device that can be manipulated or changed so as to reflect two opposite logical states of the memory device. For purposes of disclosing the subject matter herein, the memory cell 125 will be depicted as being an RRAM device, but the presently disclosed subject matter should not be considered to be limited to RRAM devices.

FIG. 5 depicts the IC product 100 after several process operations were performed. First, a layer of memory state material 118 was formed in both the memory region 102 and the logic region 104 of the product 100. In some applications, the layer of memory state material 118 may comprise multiple layers of material. In the depicted example, the memory state material 118 is positioned on and in physical contact with the upper surface of the bottom electrode 114 and on and in physical contact with the upper surface 113Y of the internal sidewall spacer 113S. The layer of memory state material 118 may be formed to any desired thickness and it may comprise any of a variety of different materials, e.g., stoichiometric $ZrO_2$, ZnO, $HfO_2$, a doped metal oxide, phase-change chalcoenides (GeSbTe, AgInSbTe), binary transition metal oxide (NiO or TiN), perovskites (e.g., $SrTiO_3$), solid-state electrolytes (GeS, GeSe, $SiO_x$), organic chart-transfer complexes (CuTCNQ), organic donor-acceptor systems (AlDCN), two dimension insulating materials (e.g., boron nitride), etc.

Next, with continued reference to FIG. 5, a layer of conductive material 120 was formed in both the memory region 102 and the logic region 104 above the layer of memory state material 118. The layer of conductive material 120 may comprise any conductive material, e.g., copper, tungsten, ruthenium, aluminum, TaN, etc., and it may be formed to any desired thickness. As will be appreciated by those skilled in the art after a complete reading of the present application, portions of the layer of conductive material 120 will become the top electrode 120E of the memory cells 125 disclosed herein. At that point, a patterned etch mask 122 was formed above the sacrificial layer of material 120. The patterned etch mask 122 exposes portions of the memory region 102 and all of the logic region 104. The patterned etch mask 122 may be made by performing known manufacturing techniques and it may be comprised of a variety of different materials, e.g., photoresist, organic planarization layer (OPL), silicon nitride, silicon dioxide, SiON, etc.

Figure 6:
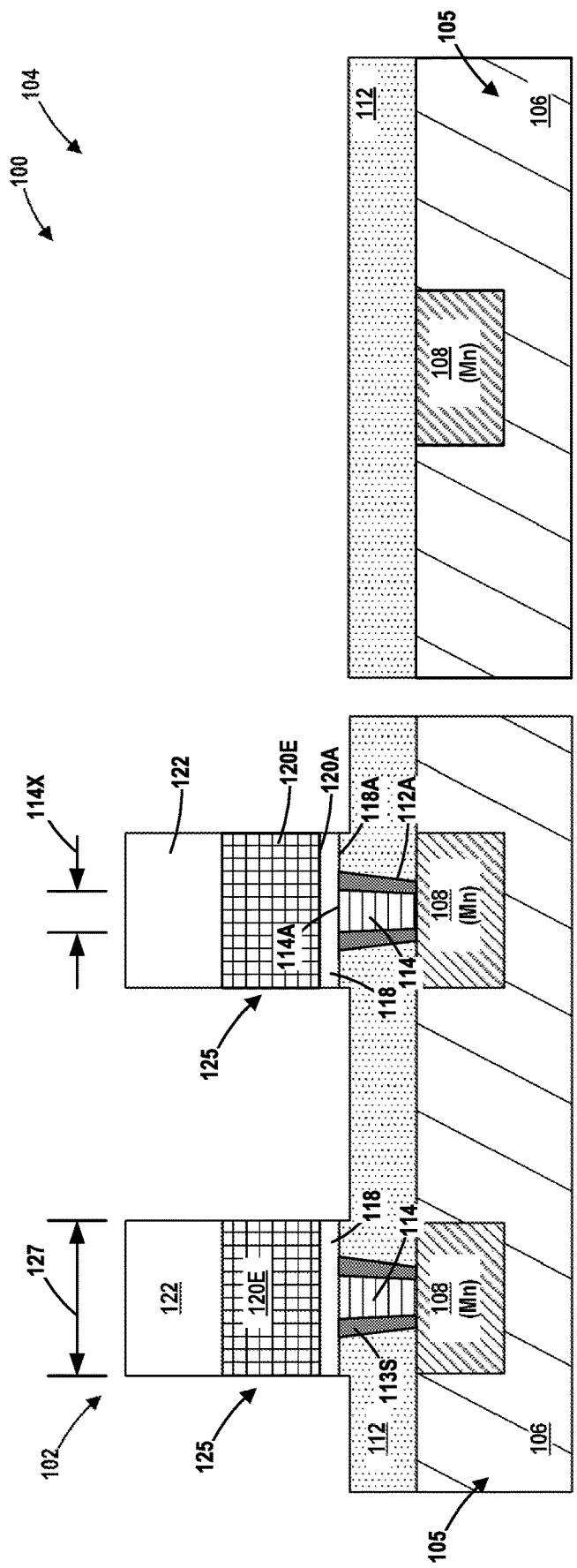

FIG. 6 depicts the IC product 100 after one or more etching processes were performed to remove exposed portions of the layer of conductive material 120 and the layer of memory state material 118 so as to form a plurality of the illustrative memory cells 125 disclosed herein.

In at least some prior art memory devices, the bottom electrode was formed from a layer of conductive material that was eventually patterned to define the bottom gate electrode. Typically, in such a prior art memory device, the layer of conductive material for the bottom electrode was blanket deposited across the product prior to the formation of the layer of memory state material 118. As a result of the patterning process, the bottom surface of such a prior art bottom electrode would have a lateral dimension 127 that is substantially equal to the lateral dimension of the prior art top electrode and to the patterned layer of memory state material. Due to the formation of the internal sidewall spacer 113S in the opening 112A, the upper surface area 114A of the bottom electrode 114 disclosed herein is less than that of a typical prior art bottom electrode. More importantly, the upper surface area 114A of the bottom electrode 114 is less than the bottom surface area 118A of the layer of memory state material 118 and less than the bottom surface area 120A of the top electrode 120E disclosed herein. The difference between the upper surface area 114A and the bottom surface area 118A and/or the bottom surface area 120A may vary depending upon the particular application. For example, in one illustrative embodiment, the upper surface area 114A may be about 20-50% of the bottom surface area 118A or about 20-50% of the bottom surface area 120A. As a result of the upper surface area 114A being relatively small as compared to the bottom surface area 118A or the bottom surface area 120A, the formation of conductive filaments (not shown) in the layer of memory state material 118 is confined within a relatively localized electric field by virtue of the smaller upper surface area 114A of the bottom electrode 114. As a result, the memory cell 125 may exhibit highly stable endurance and data retention. Note that the layer of memory state material 118 is positioned on and in physical contact with the upper surface 114A of the bottom electrode 114 and a portion of the layer of memory state material 118 is positioned on and in physical contact with an upper surface of the internal sidewall spacer 113S.

Figure 7:
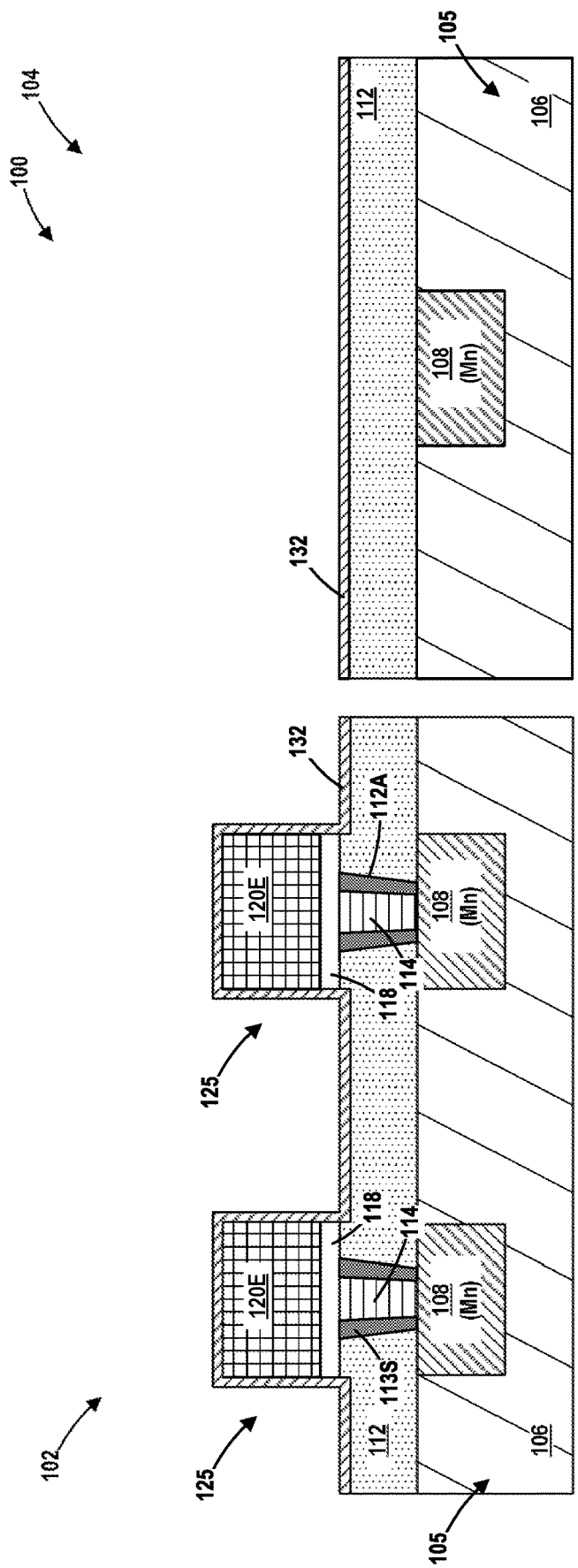

FIG. 7 depicts the IC product 100 after several process operations were performed. First, the patterned etch mask 122 was removed. Thereafter, a conformal deposition process was performed to form a conformal encapsulation layer 132 across the product 100. The conformal encapsulation layer 132 may be of any desired thickness, e.g., several to hundreds of nanometers, and it may be comprised of any of a variety of different materials, e.g., SiN, SiC, SiCN, SiOCN, $Al_2O_3$, $HfO_x$, etc.

Figure 8:
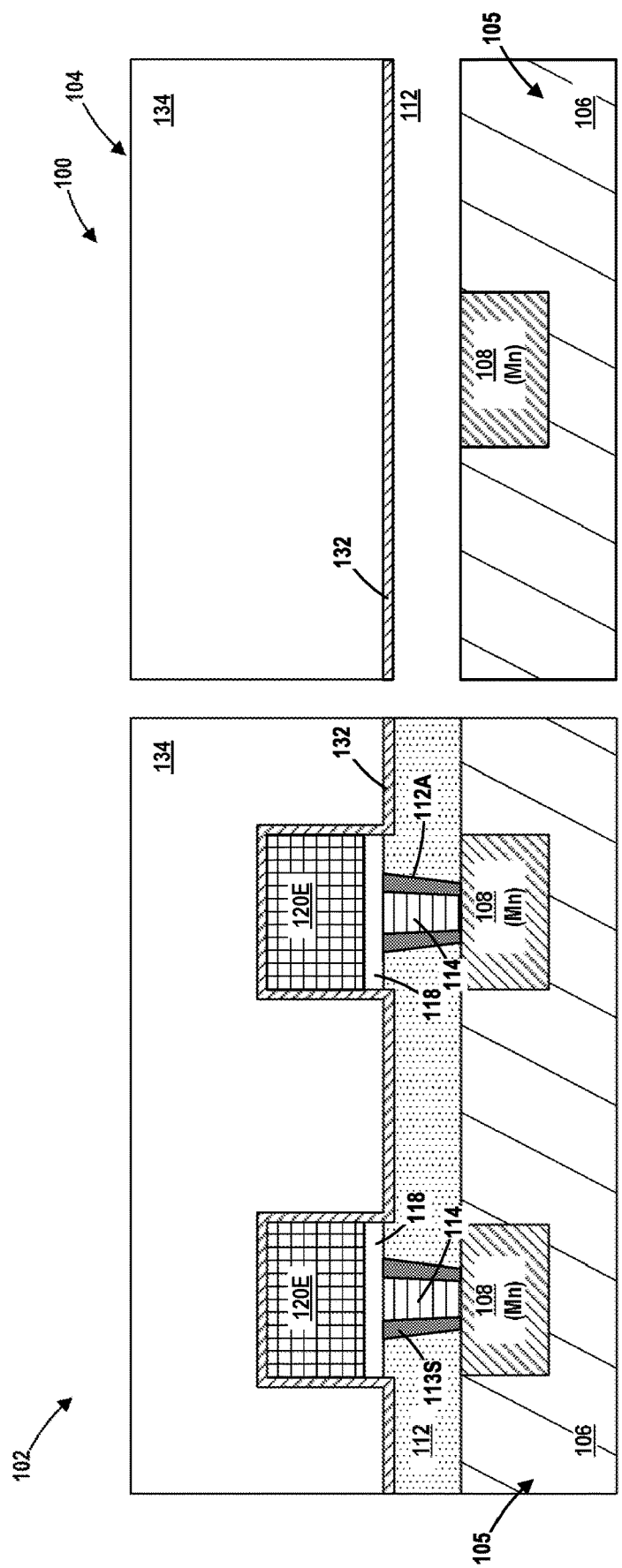

FIG. 8 depicts the IC product 100 after a representative layer of insulating material 134 was formed above the conformal encapsulation layer 132. The layer of insulating material 134 is intended to be representative in nature as it may in fact comprise multiple layers of material, e.g., insulating materials and etch stop layers. The layer of insulating material 134 may be of any desired thickness, e.g., several to thousands of nanometers, and it may be comprised of any of a variety of different materials, e.g., $SiO_2$, a low-k material, etc.

Figure 9:
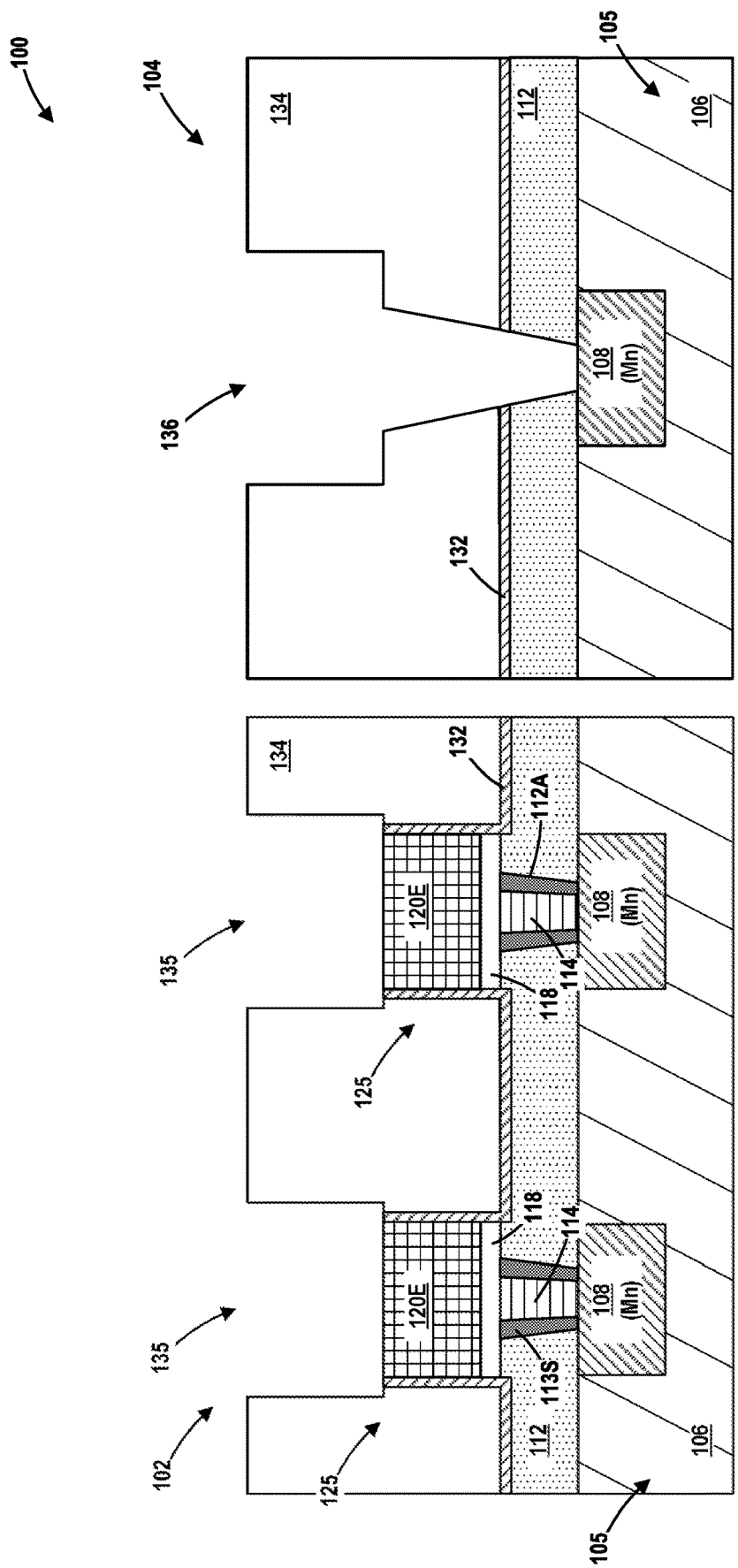

At the point of processing depicted in FIG. 8, various process operations may be performed to form various contact openings in the various layers of material 134 for various conductive contact structures to be formed in the next metallization layer—$M_{n+1}$—of the IC product 100. As will be appreciated by those skilled in the art after a complete reading of the present application, there are several possible process flows for forming such conductive contacts. Accordingly, FIG. 9 depicts the product 100 after one or more patterned etch masks (not shown) were formed above the product 100 and after various etching process operations were performed to form contact openings 135 for the memory cells 125 and a contact opening 136 in the logic region 104 for contacting the metal line 108 in the logic region 104. Note that part of the etching processes remove the portion of the conformal encapsulation layer 132 positioned above the top electrode 120E of each of the memory cells 125. However, the encapsulation layer 132 remains positioned around the outer perimeter of the memory cell 125 between the insulation material 134 and the memory cell 125. Each of the conductive contact openings 135 exposes the top electrode 120E of each of the memory cells 125. The conductive contact opening 136 exposes the metal line 108 in the logic region 104.

FIG. 10 depicts the product 100 after various process operations were performed to form conductive contact structures 138 in each of the contact openings 135 and a conductive contact structure 140 in the contact opening 136. The conductive contact structures 138, 140 may be formed using a variety of techniques. In one example, various conformal liners and/or barrier layers may be formed in the trench/via openings. Thereafter, a conductive material, such as tungsten, may be deposited so as to overfill the remaining portions of the contact openings 135, 136. At that point, a CMP process operation may be performed to remove all conductive material positioned above the upper surface of the layer of insulating material 134.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:
1. A memory cell, comprising:
a metallization layer having an upper surface and a lower surface;
at least one layer of insulating material positioned above the metallization layer;
an internal sidewall spacer positioned within the at least one layer of insulating material, the internal sidewall spacer defining a spacer opening, the internal sidewall spacer comprising an upper surface and a lower surface;

a bottom electrode positioned within the spacer opening, the bottom electrode comprising an upper surface and a lower surface;
a memory state material positioned above the upper surface of the bottom electrode and above the upper surface of the internal sidewall spacer;
a top electrode positioned above the memory state material; and
an encapsulation layer on sidewalls of the top electrode and the memory state material and on a recessed upper surface of the at least one layer of insulating material below each of the upper surface of the bottom electrode and the upper surface of the internal sidewall spacer, wherein the memory state material is positioned on and abuts each of the upper surface of the bottom electrode and the upper surface of the internal sidewall spacer,
wherein the upper surface of the metallization layer abuts a lower surface of the at least one layer of insulating material and the lower surface of the internal sidewall spacer.

2. The memory cell of claim 1, wherein the at least one layer of insulating material comprises silicon dioxide, the internal sidewall spacer comprises silicon nitride and the memory cell comprises one of an MTJ (magnetic tunnel junction) memory device, an RRAM (resistive random access memory) device, a PRAM (phase-change random access memory) device, an MRAM (magnetic random access memory) device, or a FRAM (ferroelectric random access memory) device.

3. The memory cell of claim 1, wherein the bottom electrode is positioned entirely within the spacer opening.

4. The memory cell of claim 1, wherein the upper surface of the bottom electrode defines an upper surface area of the bottom electrode, and wherein the memory state material comprises a bottom surface that defines a bottom surface area of the memory state material, wherein the upper surface area of the bottom electrode is less than the bottom surface area of the memory state material.

5. The memory cell of claim 4, wherein the upper surface area of the bottom electrode is 20-50% of the bottom surface area of the memory state material.

6. The memory cell of claim 1, wherein the upper surface of the bottom electrode defines an upper surface area of the bottom electrode, and wherein the top electrode comprises a bottom surface that defines a bottom surface area of the top electrode, wherein the upper surface area of the bottom electrode is less than the bottom surface area of the top electrode.

7. The memory cell of claim 6, wherein the upper surface area of the bottom electrode is 20-50% of the bottom surface area of the top electrode.

8. The memory cell of claim 1, further comprising a conductive contact positioned above the top electrode, the conductive contact having a bottom surface that abuts the encapsulation layer.

9. The memory cell of claim 8, wherein the bottom surface of the conductive contact abuts an entire uppermost surface of the encapsulation layer.

10. A memory cell, comprising:
a metallization layer having an upper surface and a lower surface;
at least one layer of insulating material positioned above the metallization layer;
an internal sidewall spacer positioned within the at least one layer of insulating material, the internal sidewall spacer defining a spacer opening, the internal sidewall spacer comprising an upper surface and a lower surface;
a bottom electrode positioned within the spacer opening, the bottom electrode comprising an upper surface that defines an upper surface area;
a memory state material positioned on and abuts each of the upper surface of the bottom electrode and the upper surface of the internal sidewall spacer;
a top electrode positioned above the memory state material, the top electrode comprising a bottom surface that defines a bottom surface area of the top electrode, wherein the upper surface area of the bottom electrode is less than the bottom surface area of the top electrode;
and an encapsulation layer on sidewalls of the top electrode and the memory state material and on a recessed upper surface of the at least one layer of insulating material below each of the upper surface of the bottom electrode and the upper surface of the internal sidewall spacer,
wherein the upper surface of the metallization layer abuts a lower surface of the at least one layer of insulating material and the lower surface of the internal sidewall spacer.

11. The memory cell of claim 10, wherein the bottom electrode is positioned entirely within the spacer opening and wherein the upper surface of the bottom electrode is coplanar with the upper surface of the internal sidewall spacer.

12. The memory cell of claim 10, wherein the upper surface area of the bottom electrode is 20-50% of the bottom surface area of the top electrode.

13. The memory cell of claim 10, further comprising a conductive contact positioned above the top electrode, the conductive contact having a bottom surface that abuts the encapsulation layer.

* * * * *